(12) United States Patent
Shinohara et al.

(10) Patent No.: US 9,337,145 B2
(45) Date of Patent: May 10, 2016

(54) SEMICONDUCTOR MEMORY DEVICE

(71) Applicant: KABUSHIKI KAISHA TOSHIBA, Minato-ku (JP)

(72) Inventors: Hiroshi Shinohara, Yokosuka (JP); Atsuhiro Sato, Tokyo (JP); Keisuke Yonehama, Kamakura (JP); Yasuyuki Baba, Zama (JP); Toshifumi Minami, Yokohama (JP); Hiroyuki Maeda, Kawasaki (JP); Shinji Saito, Yokohama (JP); Hideyuki Kamata, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/643,585

(22) Filed: Mar. 10, 2015

(65) Prior Publication Data
US 2016/0071793 A1   Mar. 10, 2016

Related U.S. Application Data

(60) Provisional application No. 62/048,380, filed on Sep. 10, 2014.

(51) Int. Cl.
| | |
|---|---|
| *H01L 27/108* | (2006.01) |
| *H01L 23/528* | (2006.01) |
| *H01L 27/115* | (2006.01) |
| *H01L 23/535* | (2006.01) |
| *H01L 21/768* | (2006.01) |
| *H01L 21/02* | (2006.01) |

(52) U.S. Cl.
CPC .......... *H01L 23/528* (2013.01); *H01L 21/0217* (2013.01); *H01L 21/02164* (2013.01); *H01L 21/76802* (2013.01); *H01L 21/76895* (2013.01); *H01L 23/535* (2013.01); *H01L 27/11568* (2013.01); *H01L 27/11582* (2013.01)

(58) Field of Classification Search
USPC ......................................... 257/324
See application file for complete search history.

(56) References Cited

U.S. PATENT DOCUMENTS

| | | | |
|---|---|---|---|
| 6,064,085 A * | 5/2000 | Wu ............................... | 257/296 |
| 2007/0246782 A1* | 10/2007 | Philipp et al. .................. | 257/379 |
| 2009/0267128 A1 | 10/2009 | Maejima | |
| 2009/0268522 A1 | 10/2009 | Maejima | |
| 2010/0117132 A1* | 5/2010 | Chou et al. ..................... | 257/302 |
| 2011/0058418 A1* | 3/2011 | Choi et al. ............... | 365/185.05 |
| 2014/0042383 A1* | 2/2014 | Inokuma et al. .................. | 257/4 |
| 2014/0299831 A1* | 10/2014 | Park ................................. | 257/4 |

* cited by examiner

*Primary Examiner* — Thao P Le
(74) *Attorney, Agent, or Firm* — Oblon, McClelland, Maier & Neustadt, L.L.P

(57) ABSTRACT

According to one embodiment, a semiconductor memory device includes: a semiconductor substrate; a first semiconductor pillar above the semiconductor substrate; a first insulating layer comprising a first section and a second section, the first section being in contact with the semiconductor substrate and a bottom of the first semiconductor pillar, and the second section covering a side of the first semiconductor pillar; conductive layers and second insulating layers stacked one by one above the semiconductor substrate and covering the second section of the first insulating layer; a first plug on the first semiconductor pillar; and an interconnect on the first plug.

9 Claims, 10 Drawing Sheets

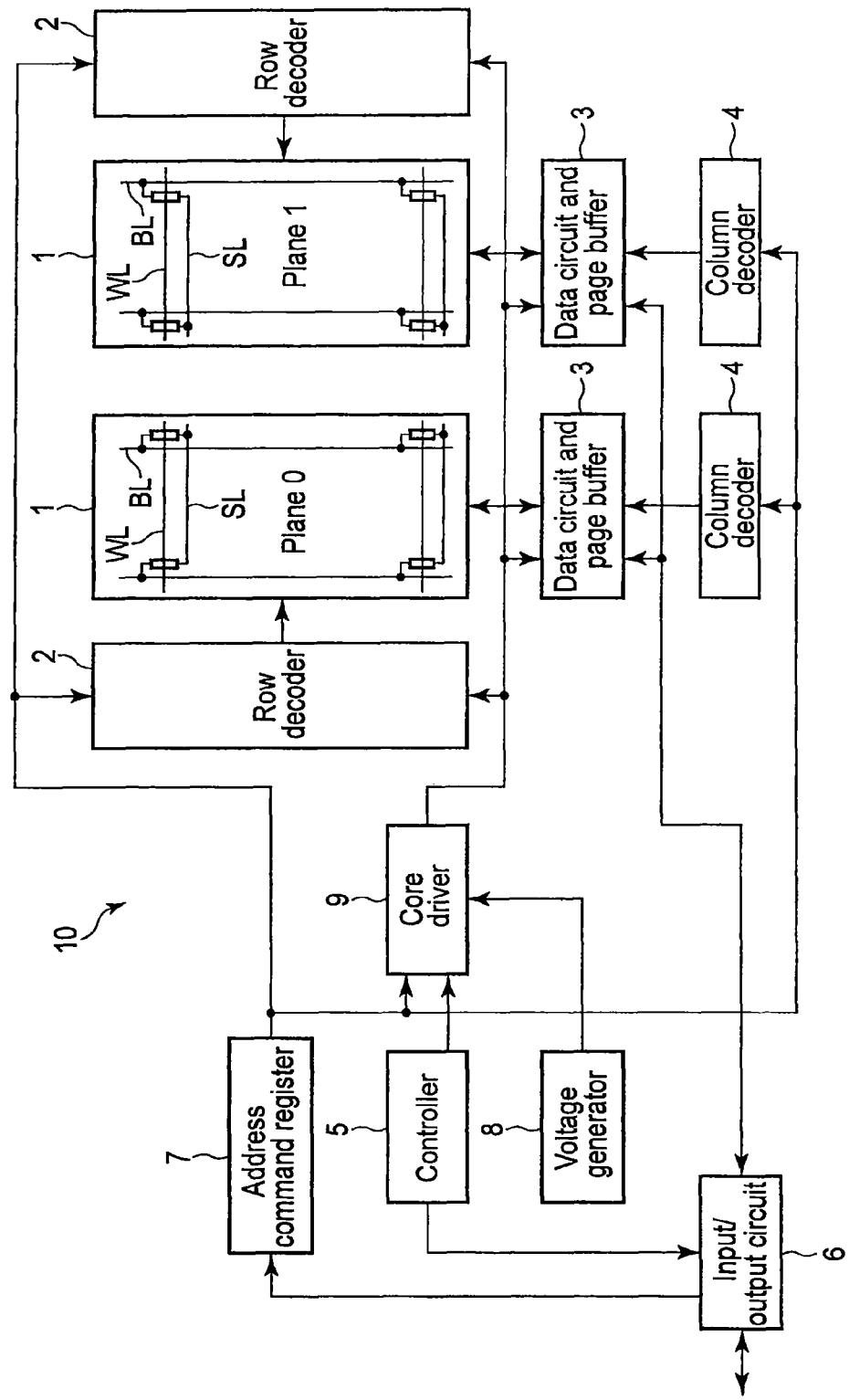
F I G. 1

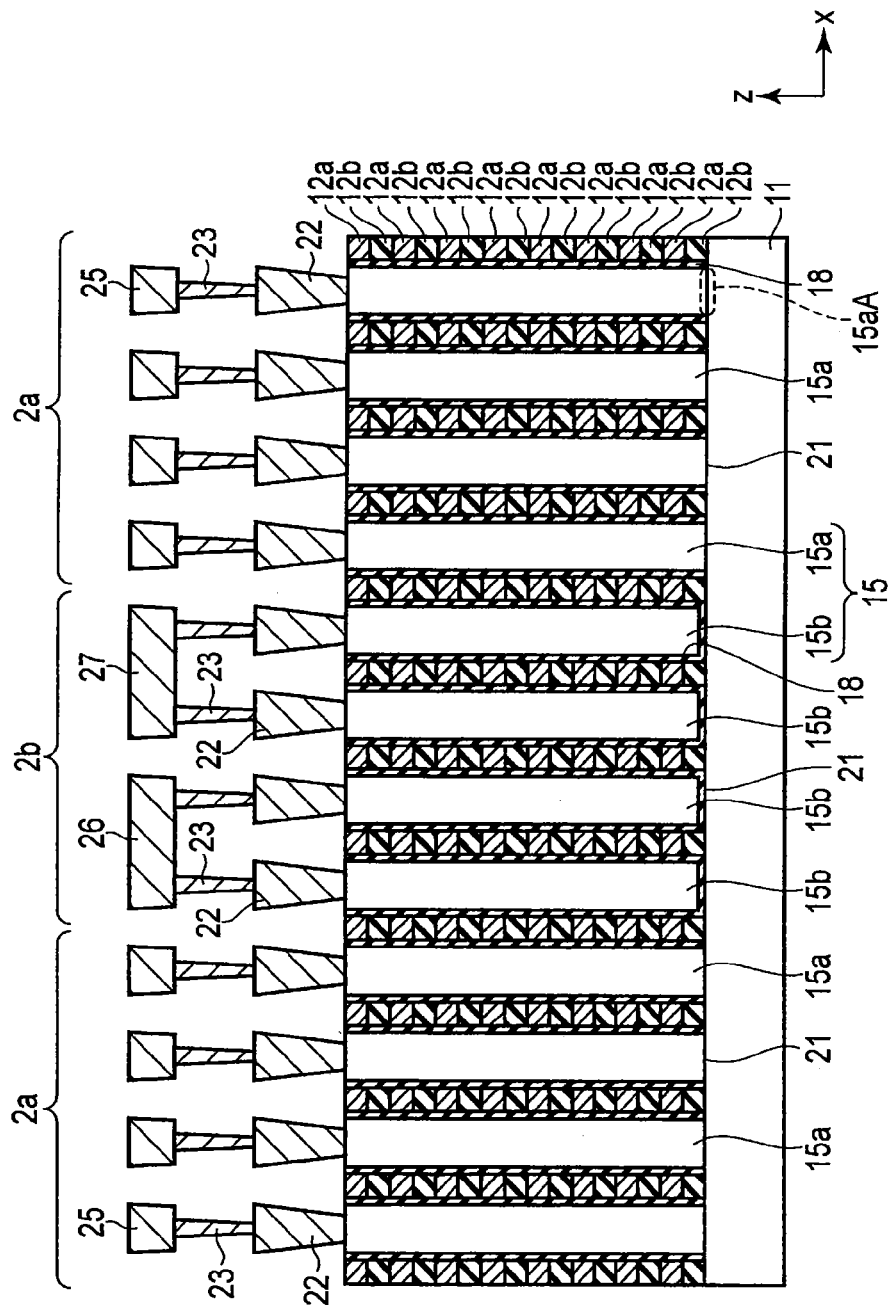
F I G. 3

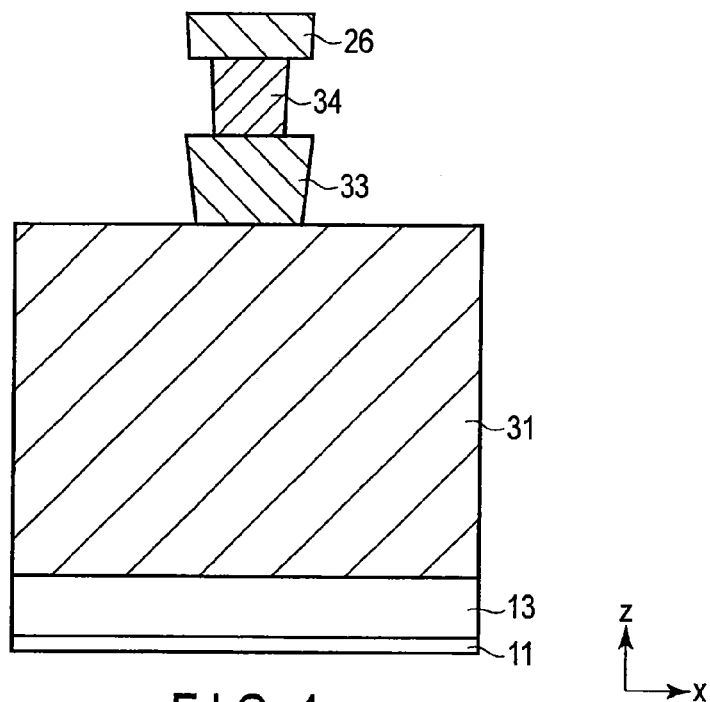
F I G. 4
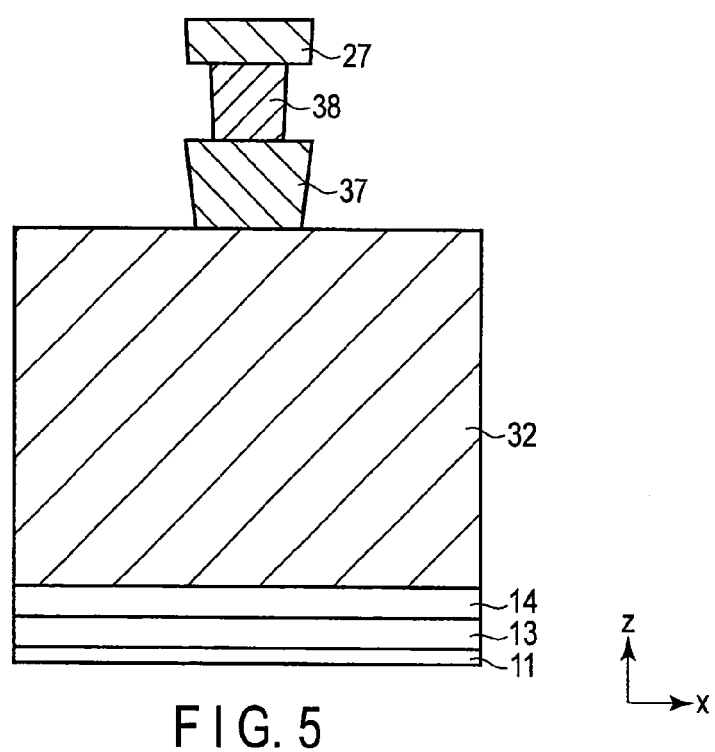
F I G. 5

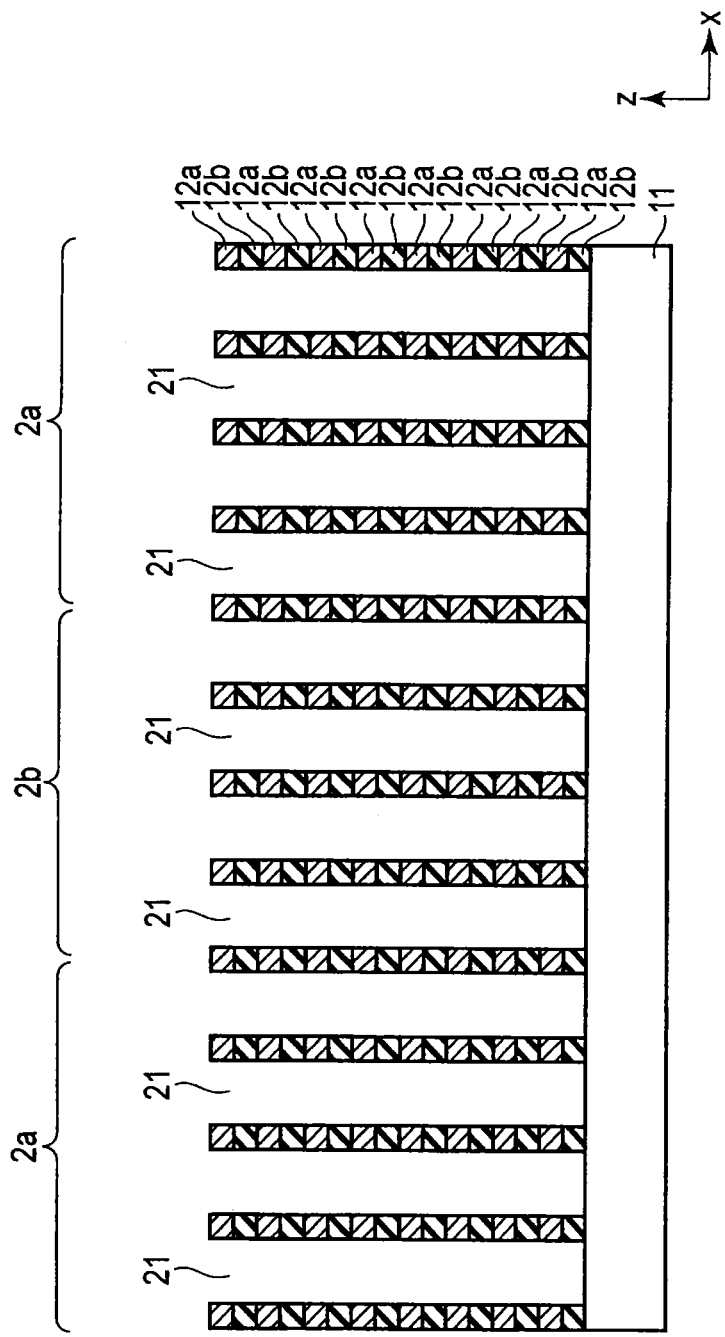
F I G. 6

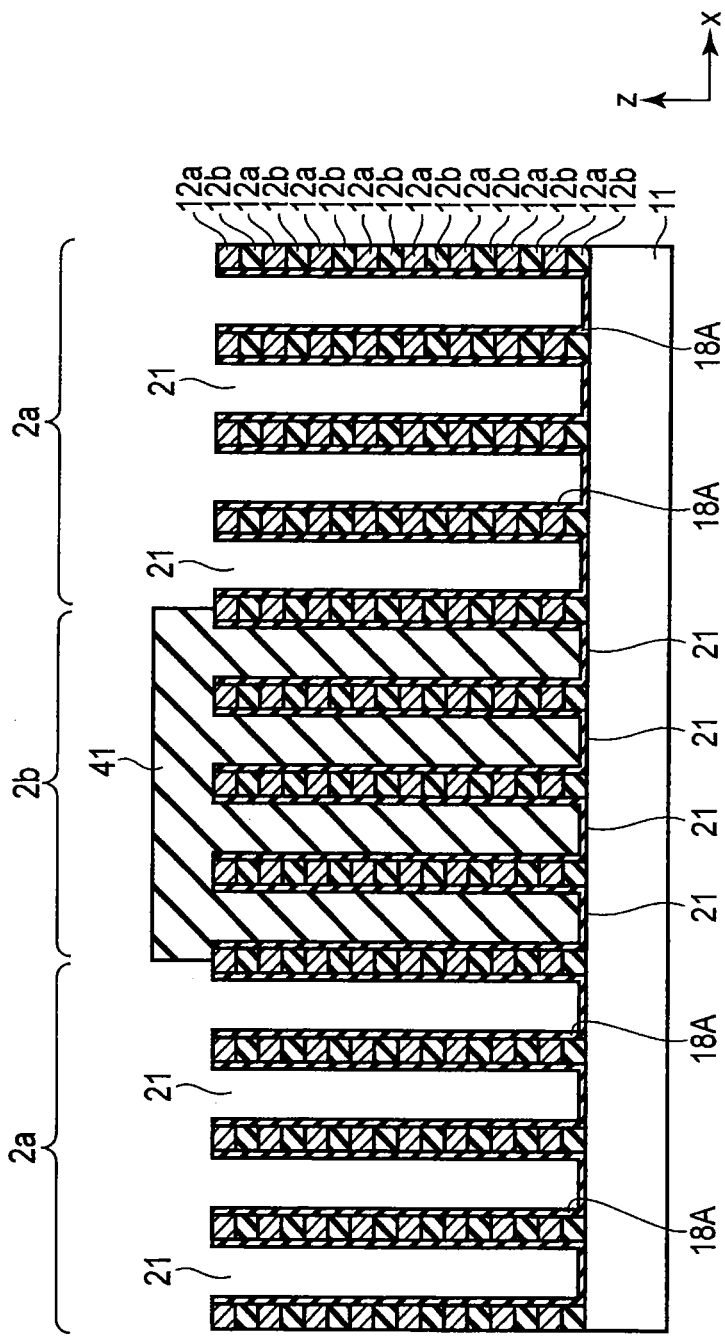
F I G. 8

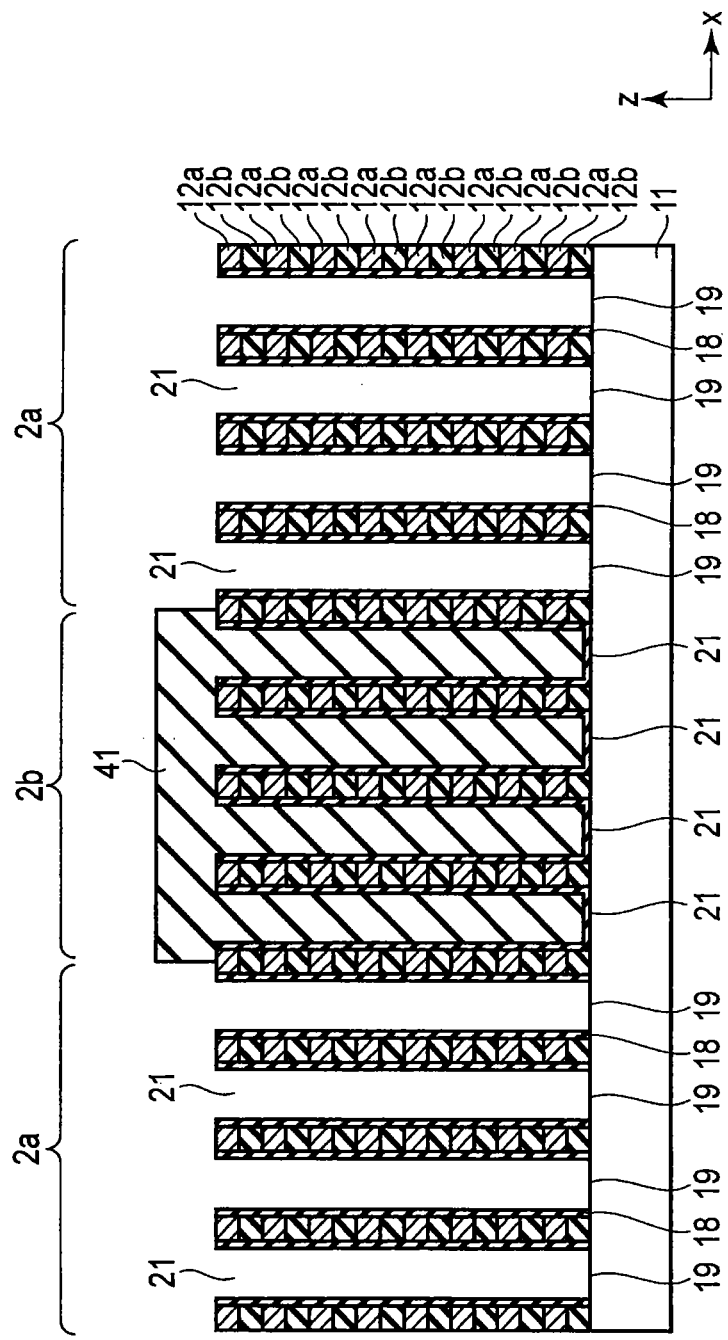
F I G. 9

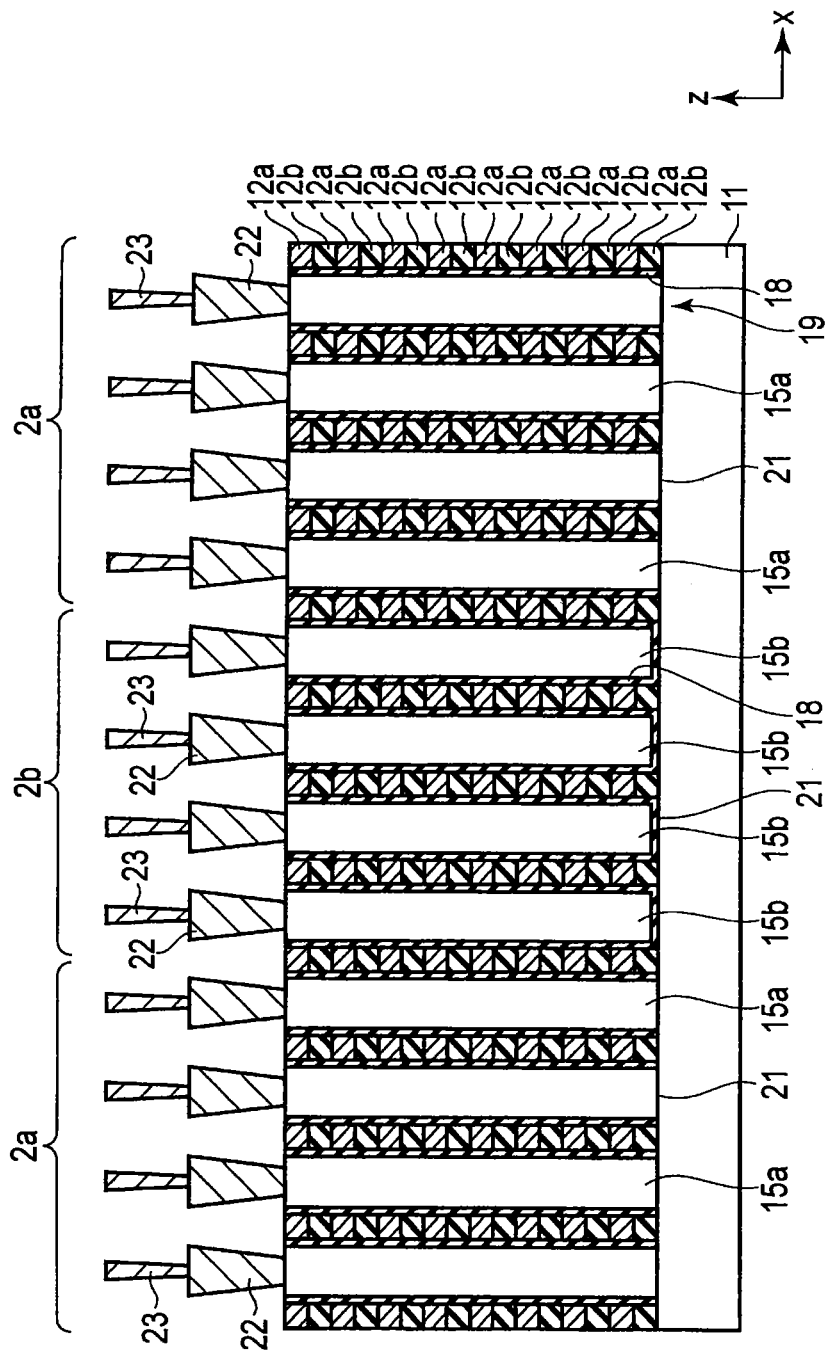
F I G. 10

SEMICONDUCTOR MEMORY DEVICE

CROSS-REFERENCE TO RELATED APPLICATIONS

This application claims the benefit of U.S. Provisional Application No. 62/048,380, filed Sep. 10, 2014, the entire contents of which are incorporated herein by reference.

FIELD

Embodiments relate to a semiconductor memory device.

BACKGROUND

NAND flash memories with a three-dimensional structure are known.

BRIEF DESCRIPTION OF THE DRAWINGS

FIG. 1 illustrates functional blocks of a semiconductor memory device of one embodiment;

FIG. 3 illustrates the sectional view along the III-III line of FIG. 2;

FIG. 4 illustrates the sectional view along the IV-IV line of FIG. 2;

FIG. 5 illustrates the sectional view along the V-V line of FIG. 2;

FIG. 6 illustrates one step of a process of manufacturing the memory device of one embodiment;

FIG. 8 illustrates the step following FIG. 7;

FIG. 9 illustrates the step following FIG. 8;

FIG. 10 illustrates the step following FIG. 9; and

DETAILED DESCRIPTION

Figure 2:
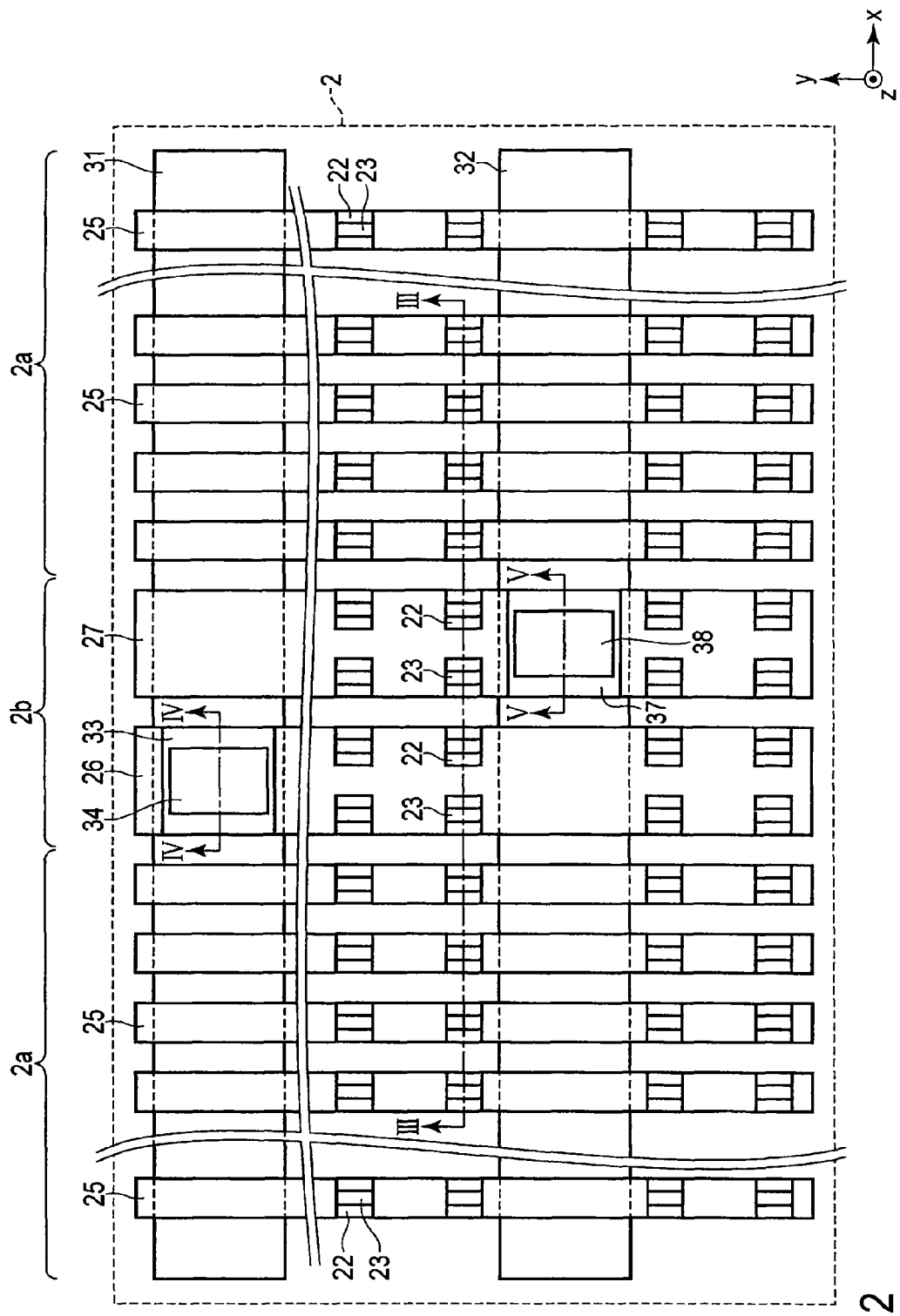
FIG. 2 illustrates a plan view of part of the semiconductor memory device of one embodiment.

According to one embodiment, a semiconductor memory device includes: a semiconductor substrate; a first semiconductor pillar above the semiconductor substrate; a first insulating layer comprising a first section and a second section, the first section being in contact with the semiconductor substrate and a bottom of the first semiconductor pillar, and the second section covering a side of the first semiconductor pillar; conductive layers and second insulating layers stacked one by one above the semiconductor substrate and covering the second section of the first insulating layer; a first plug on the first semiconductor pillar; and an interconnect on the first plug.

Embodiments will be described with reference to figures in the following. In the following description, components with substantially the same functionalities and configurations will be referred to with the same reference numeral, and repeated descriptions may be omitted. The figures are schematic. An embodiment illustrates the device and method for materializing the technical idea of this embodiment, and the technical idea of an embodiment does not specify the quality of the material, form, structure, arrangement of components, etc. to the following.

FIG. 1 illustrates functional blocks of a semiconductor memory device 10 of one embodiment. The device 10 includes components, such as memory cell arrays 1, row decoders 2, data circuit and page buffers 3, column decoders 4, a controller 5, an input and output circuit 6, an address command register 7, a voltage generator 8, and a core driver 9.

Each memory cell array 1 includes physical blocks. Each physical block includes memory cells, word lines WL, bit lines BL, a source line SL, etc. The memory cell arrays 1 may be referred to as planes.

The row decoders 2 receive a block address signal, etc., from the address command register 7, and receive a word line control signal and a select gate line control signal from the core driver 9. The row decoders 2 select physical blocks, word lines, etc. in accordance with the received block address signal, word line control signal, and select gate line control signal.

The data circuit and page buffers 3 temporarily store data read from the memory cell arrays 1, receive write data from outside the device 10, and write the received data to the selected memory cells. The column decoders 4 receive a column address signal from the address command register 7, and decode the received column address signal. The column decoders 4 control input and output of data in the data circuit and page buffers 3 in accordance with the decoded address signal.

The controller 5 receives various commands from the address command register 7. These commands instruct a read, a write, or an erasure, etc, for example. The controller 5 controls the voltage generator 8 and the core driver 9 in accordance with sequences based on the commands. The voltage generator 8 generates various voltages in accordance with instructions from the controller 5. In accordance with the instructions from the controller 5, the core driver 9 controls the row decoders 2 and the data circuit and page buffers 3, in order to control the word lines WL and the bit lines BL. The input and output circuit 6 controls the input of commands, addresses and data from or to outside the device 10.

FIG. 2 illustrates a plan view of part of the memory cell array 2. FIGS. 3 to 5 illustrate the sectional views along the III-III line, the IV-IV line, and the V-V line of FIG. 2, respectively. A memory cell array 2 includes ordinary areas 2a and a shunt area 2b. The shunt area 2b is located between the two ordinary areas 2a.

The device 10 has a substrate 11. The substrate 11 includes semiconductor material as main components, and includes, for example, silicon. The substrate 11 has a p-well 13 and an n-type diffusion layer 14 in the surface thereof. The p-well 13 includes p-type impurities. The n-type diffusion layer 14 includes n-type impurities, forms part of the source line SL, and is provided in the p-well 13.

On the substrate 11, conductive layers 12a and insulating layers 12b are provided. The conductive layers 12a and the insulating layers 12b are alternately stacked. In the conductive layers 12a and the insulating layers 12b, pillars 15 are provided. Parts of the conductive layers 12a between adjacent pillars 15 serve as gate electrodes in the ordinary area 2a. When observed from above as in FIG. 2, the pillars 15 have, in the xy-plane, circles, ellipses, or shapes similar to those, and are arranged in a matrix. The pillars 15 include semiconductor material as main components, and include, for example, silicon. The pillars 15 have impurities doped and have conductivity. The pillars 15 include pillars 15a and pillars 15b. The pillars 15a are provided in the ordinary areas 2a, and the pillars 15b are provided in the shunt area 2b. The shunt area 2b includes at least two pillars 15b, and FIGS. 2 and 3 illustrate the example of four pillars 15b.

Each pillar 15 is provided in a memory hole 21, which extends between the top layer of the layers 12a and 12b and the upper surface of the substrate 11. In each memory hole 21, semiconductor material is provided with an insulating layer 18 interposed therebetween. For example, the semiconductor material is filled in each memory hole 21 with the insulating layer 18 therebetween. The insulating layers 18 in the ordinary areas 2a and the shunt area 2b, however, differ in structure. In accordance with this, the pillars 15a have a structure different from that of the pillars 15b. Specifically, in the shunt area 2b, the insulating layers 18 cover the inner surfaces of the memory holes 21. More specifically, the insulating layers 18 cover side and bottom surfaces of the memory holes 21 in the shunt area 2b. In contrast, in the ordinary areas 2a, the insulating layers 18 cover at least the side surfaces of the memory holes 21. Furthermore, the insulating layers 18 of the ordinary areas 2a are provided partly on the bottoms of the memory holes 21, and partly cover the bottom surfaces of the memory holes 21. Alternatively, in the ordinary areas 2a, the insulating layers 18 are not provided on the bottoms of the memory holes 21. FIG. 3 illustrates an example without the insulating layers 18 on the bottoms of the memory holes 21.

The pillars 15a include parts 15aA. The parts 15aA are part of the pillars 15a at the bottoms thereof, and are located where the insulating layers 18 in the memory holes 21 of the ordinary areas 2a are not provided. The parts 15aA fill where the insulating layers 18 are not provided in the memory holes 21 of the ordinary area 2a, for example. Moreover, the parts 15aA are in contact with the substrate 11. Therefore, the pillars 15a of the ordinary areas 2a are electrically coupled to the substrate 11. In contrast, at the bottoms of the memory holes 21 of the shunt area 2b, the insulating layers 18 are located. For this reason, the pillars 15b of the shunt area 2b are not in contact with the substrate 11, and are electrically insulated from the substrate 11.

Thus, the ordinary areas 2a and the shunt area 2b all include the pillars 15 except for the difference in having electrical connections to the substrate 11 or not. The pillars 15 are arranged regularly along the xy-plane over the ordinary areas 2a and the shunt area 2b.

The insulating layers 18 include a layer of silicon oxide, a layer of silicon nitride, and a layer of silicon oxide, for example. These layers are stacked along the direction of the thickness of the insulating layers 18. The silicon oxide layer, the silicon nitride layer, and the silicon oxide layer serve as a block insulating layer, a charge storage layer, and a tunnel insulating layer of a memory cell transistor, respectively. This results in serially-coupled memory cell transistors provided along a pillar 15.

Another example structure of the memory cell array 2 is described in, for example, the specification of the U.S. patent application Ser. No. 12/407,403 filed on Mar. 19, 2009 and titled "three-dimensional lamination nonvolatile semiconductor memory." Still another example is described in, for example, the specification of the U.S. patent application Ser. No. 12/406,524 filed on Mar. 18, 2009 and titled "three-dimensional lamination nonvolatile semiconductor memory." The entire contents of these patent applications are incorporated by reference in the specification of the present application.

Each pillar 15 is coupled at the top to a conductive plug 22. Each plug 22 is coupled at the top to a plug 23. The plugs 23 are coupled at the tops to one of bit lines 25 and shunt interconnects 26 and 27. Specifically, the plugs 23 of the ordinary areas 2a are coupled to the bit lines 25. Some of the plugs 23 of the shunt area 2b are coupled to the shunt interconnect 26, and the remaining ones of the plugs 23 of the shunt area 2b are coupled to the shunt interconnect 27. FIGS. 2 and 3 illustrate an example where two plugs 23 lined up along the x-axis in the shunt area 2b are coupled to the shunt interconnect 26 and another two plugs 23 lined up along the x-axis in the shunt area 2b are coupled to the shunt interconnect 27. The bit lines 25 and the shunt interconnects 26 and 27 have conductivity, and are located in an M1 layer.

A contact 31 is provided between the shunt interconnect 26 and the substrate 11. A contact 32 is provided between the shunt interconnect 27 and the substrate 11. The contacts 31 and 32 have a plate shape which spreads in the xz-plane, and extend along the x-axis. The contact 31 is coupled at the top in the shunt area 2b to the shunt interconnect 26 through plugs 33 and 34, and at the bottom to the p-well 13. The shunt interconnect 26 receives a well potential from the controller 3 (for example, a potential generator in the controller 3) of the device 10. The well potential is a potential which the p-well 13 should have. The contact 32 is coupled at the top to the shunt interconnect 27 through plugs 37 and 38, and at the bottom to the n-type diffusion layer 14. The shunt interconnect 27 forms part of the source line SL, and receives a source line potential from the controller 3 (for example, the potential generator in the controller 3).

Referring now to FIG. 3 and FIGS. 6 to 10, a process of manufacturing the semiconductor memory device 10 will be described. FIGS. 6 to 10 illustrate steps of the manufacturing process of the device 10 in order, and illustrate the sectional views along the III-III line of FIG. 2. As illustrated in FIG. 6, the conductive layers 12a and the insulating layers 12b are formed on the substrate 11. Specifically, various diffusion layers (not shown) are first formed in the surface of the substrate 11. The diffusion layers include the p-well 13 and the n-type diffusion layer 14. On the substrate 11, insulating layers and conductive layers are stacked alternately in order. The insulating layers and conductive layers are layers which will be processed into the insulating layers 12b and the conductive layers 12a, respectively. A mask (not shown) is then formed on the top conductive layer. The mask has openings where the memory holes 21 will be formed. With etching, such as reactive ion etching (RIE), through this mask, part of the insulating layers and conductive layers is removed. This results in completion of the insulating layers 12b and the conductive layer 12a. The memory holes 21 reach from the top of the top layer of the set of the insulating layers and conductive layers to the substrate 11. The mask is removed after formation of the memory hole 21.

Figure 7:
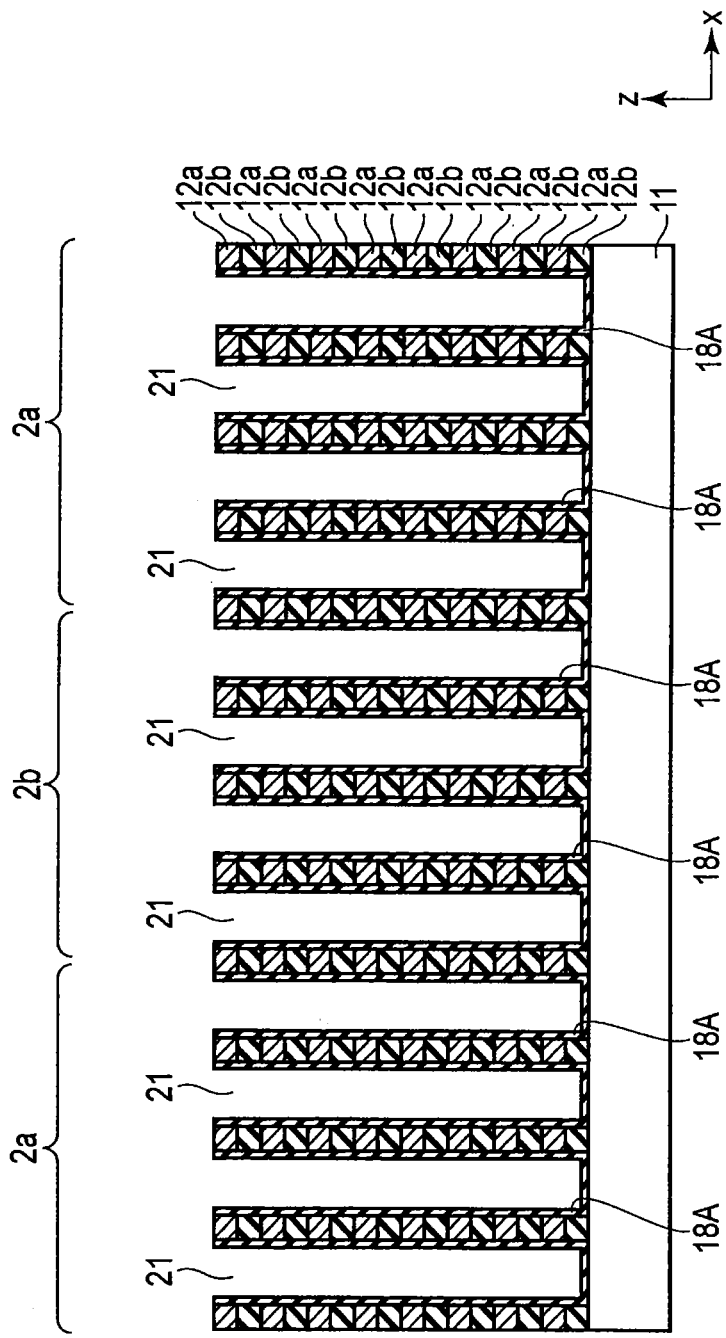
FIG. 7 illustrates the step following FIG. 6.

As illustrated in FIG. 7, in the memory holes 21, insulating layers 18A are formed by, for example, chemical vapor deposition (CVD). The insulating layers 18A are layers which will be processed into the insulating layers 18 by removing part thereof. In accordance with the number and type of layers in the insulating layers 18, the CVD may be executed two or more times. The insulating layer 18A covers the side and bottom surfaces of each memory hole 21. In the stage of FIG. 7, the bottom surfaces of the memory holes 21 of the ordinary areas 2a are also covered with the insulating layers 18A.

As illustrated in FIG. 8, the memory holes 21 of the shunt area 2b are buried by insulating material 41. Specifically, the insulating material 41 is first deposited on the structure obtained through the steps so far. The insulating material 41 preferably has a high burying property and is buried using techniques with a high burying ability. The insulating material 41 is a resist, for example. As a result of the burying, all memory holes 21 are buried by the insulating material 41. The insulating material 41 is also formed on the top conductive layer 12a. A mask (not shown) is then formed on the insulating material 41 on the top conductive layer 12a. The mask has openings above the entirety of the ordinary areas 2a, and remains above the shunt area 2b. With, etching through this mask, the insulating material 41 in the memory holes 21 of the ordinary areas 2a is removed. This results in the insulating material 41 remaining only in the memory holes 21 of the shunt area 2b.

As illustrated in FIG. 9, part of the insulating layers 18A on the bottoms of the memory holes 21 of the ordinary areas 2a is partly or entirely removed. Specifically, while the insulating material 41 is used as a mask, the insulating layers 18A on the bottoms of the memory holes 21 are removed by etching. As a result, in each memory hole 21 of the ordinary areas 2a, a hole 19 is formed in the insulating layer 18A, and thereby the insulating layer 18 is formed. The hole 19 reaches the top of the substrate 11, and therefore the top of the substrate 11 is exposed at the bottom of each memory hole 21. As described above, the hole 19 may extend over part or the entirety of the bottom of each memory hole 21. In contrast, the shunt area 2b is protected from the etching by the insulating material 41. This leaves part of the insulating layers 18 in the memory holes 21 of the shunt area 2b at the bottoms of the memory holes 21.

As illustrated in FIG. 10, the pillars 15 and the plugs 22 and 23 are formed. Specifically, the insulating material 41 is removed first. The memory holes 21 are then buried with semiconductor material which will form the pillars 15. Impurities are doped into the semiconductor material as described above, and thereby the pillars 15 are formed. The impurity-doped semiconductor material is buried in the memory holes 21 not only in the ordinary areas 2a but also in the shunt area 2b. For this reason, the pillars 15b are also formed in the memory holes 21 of the shunt area 2b. In the ordinary areas 2a, the semiconductor material reaches the substrate 11 through the holes 19, i.e., parts 15aA of the pillars 15a are formed. In contrast, in the shunt area 2b, the semiconductor material is blocked by the parts of the insulating layers 18 on the bottoms of the memory holes 21 from reaching the substrate 11. An interlayer dielectric (not shown) is then formed on the structure obtained by the steps so far. Then, in the interlayer dielectric, formations of holes by etching with a mask and burying of conductive material in the holes are repeated, and thereby the plugs 22 and 23 are formed. The plugs 22 and 23 are formed not only in the ordinary areas 2a but in the shunt area 2b.

As illustrated in FIG. 3, the bit lines 25 and the shunt interconnects 26 and 27 are formed. Specifically, the mask for formation of holes for the plugs 22 and 23 is removed first. An interlayer dielectric (not shown) is then formed on the structure obtained by the steps so far. In the interlayer dielectric, trenches for the bit lines 25 and the shunt interconnects 26 and 27 are formed by etching with a mask. The trenches have the same shapes as the bit lines 25 and the shunt interconnects 26 and 27 in the xy-plane. The trenches are then buried with conductive material, and thereby the bit, lines 25 and the shunt interconnects 26 and 27 are formed. Processing for formation of the contacts 31 and 32 and the plugs 33, 34, 37, and 38 is inserted in somewhere among steps from FIGS. 6 to 10 and the subsequent FIG. 3. Thus, the device 10 of FIGS. 2 and 3 is completed.

As described above, the semiconductor memory device 10 also has the pillars 15b and the plugs 22 and 23 between the substrate 11 and the shunt interconnects 26 and 27 in the shunt area 2b as in the ordinary areas 2a. In contrast, the pillars 15b have the insulating layers 18 between the pillars and the substrate 11 to be electrically insulated from the substrate 11. This enables provision, in the shunt area 2b, of the same components as those in the ordinary areas 2a, i.e., the pillars 15b and the plugs 22 and 23, while the electric connections between the shunt interconnects 26 and 27 and the substrate 11 are avoided. This allows a regular arrangement of the plugs 22 and 23 to be maintained over the ordinary areas 2a and the shunt area 2b. In other words, the regular arrangement of the plugs 22 and 23 is not disturbed. This eliminates the necessity of provision of dummy regions, which would be necessary due to the disturbance of a regular arrangement. No dummy region is necessary, and therefore the area of the semiconductor memory device 10 can be small. The details are as follows.

Figure 11:
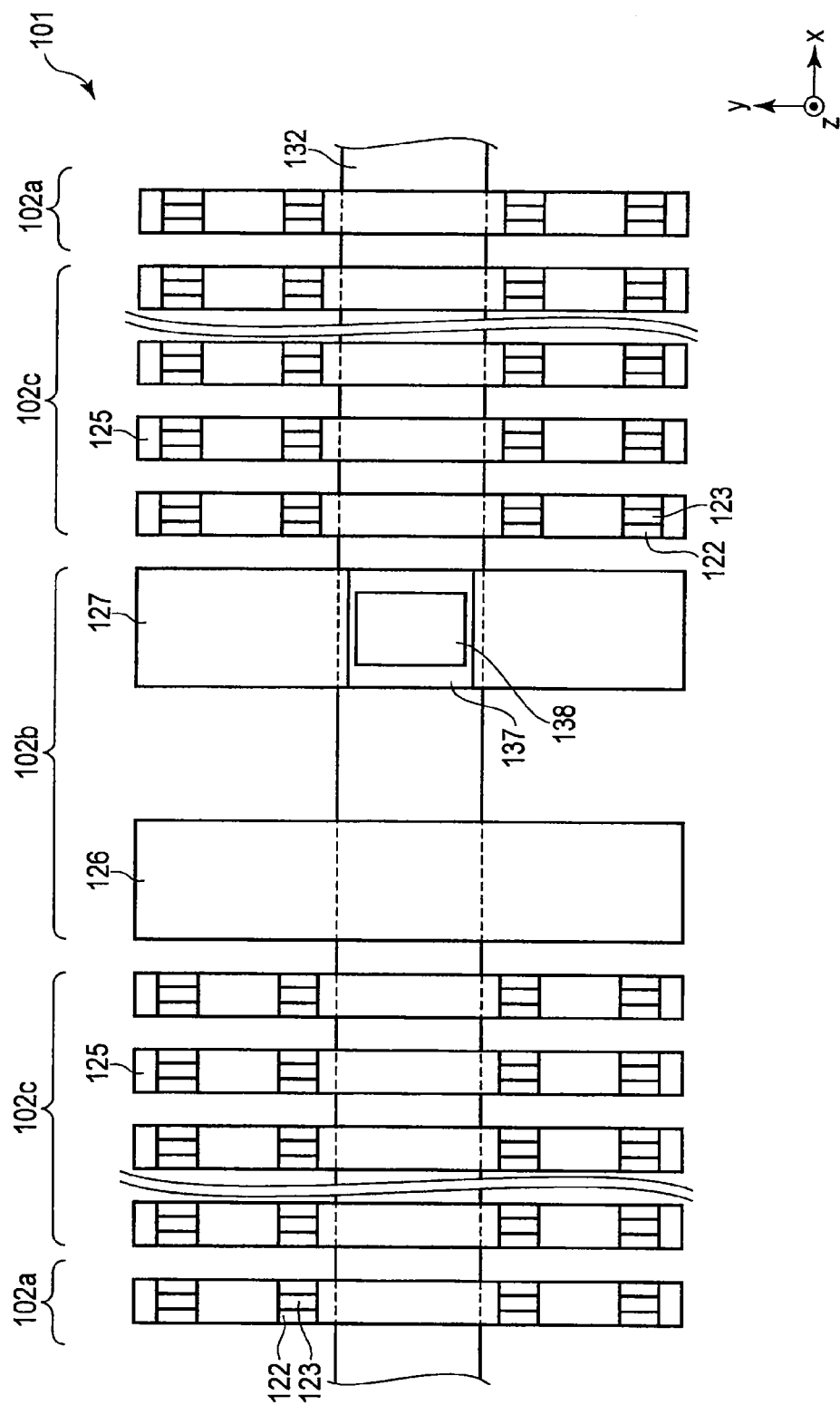
FIG. 11 illustrates a plan view of a semiconductor memory device for reference.

FIG. 11 illustrates a plan view of a semiconductor memory device for reference. This device for reference 101 has the same components and arrangement as the device 10. FIG. 11 illustrates the same part as FIG. 2, i.e., ordinary areas 102a and a shunt area 102b of the memory cell array. Plugs 122 and 123, bit lines 125, shunt interconnects 126 and 127, the contacts 132, and plugs 137 and 138 of FIG. 11 correspond to the plugs 22 and 23, the bit lines 25, the shunt interconnects 26 and 27, the contacts 32, and the plugs 37 and 38, respectively. Specifically, the shunt interconnect 126 is coupled to a p-well (not shown) in a substrate by a contact (not shown). The shunt interconnect 127 is coupled to the contact 132 by the plugs 137 and 138, and the contact 132 is coupled to a diffusion layer in the surface of the substrate. Between the bit lines 125 and the substrate, there are provided pillars (not shown) similar to the pillars 15 and the plugs 122 and 123, and the pillars 15 and the plugs 122 and 123 electrically couple the bit lines 125 and the substrate.

As illustrated in FIG. 11, without use of the embodiment, pillars and the plugs 122 and 123 the same as those in the ordinary areas 102a cannot be provided between the shunt interconnect 126 and the substrate. Providing them would lead to an electrical connection between the shunt interconnect 126 and the substrate, which must be avoided. For such a reason, pillars or the plugs 122 and 123 are not provided in the shunt area 102b as can be seen from FIG. 11. Not providing pillars and the plugs 122 and 123 disturbs the regular arrangement of these components. Failure of the regular arrangement can make the bit lines 125 and the plugs 122 and 123 in the boundaries of regular-arrangement-failed area different in dimensions from those in other areas. Such variation in dimensions results from, for example, the variations in light proximity effects during formation of the bit lines 125 and the plugs 122 and 123. In order to address the variation of dimensions, the dummy areas 102c are required in the boundaries.

The dummy areas 102c include conductive layers 125c, 122c, and 123c. The conductive layers 125c, 122c, and 123c have the same structures as the bit lines 125 and the plugs 122 and 123, respectively. The conductive layers 125c, however, are not used as bit lines, and therefore the conductive layers 125c, 122c, and 123c are dummy bit lines and dummy plugs. The conductive layers 125c, 122c, and 123c may have different dimensions from those of the bit lines 125 and the plugs 122 and 123; however they are not used, which can bring the dimensions of the bit line 125 and the plugs 122 and 123 close to uniformity. The dummy areas 102c, however, increase the area of the device 101.

In contrast, the device 10 of the embodiment does not require the dummy areas 102c between the ordinary areas 2a and the shunt area 2b as can be seen from FIG. 3. Therefore, the device 10 can have an area smaller than that of the device of the FIG. 11 example.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a semiconductor substrate;
   a first semiconductor pillar above the semiconductor substrate;
   a first insulating layer comprising a first section and a second section, the first section being in contact with the semiconductor substrate and a bottom of the first semiconductor pillar, and the second section covering a side of the first semiconductor pillar;
   conductive layers and second insulating layers stacked one by one above the semiconductor substrate and covering the second section of the first insulating layer;
   a first plug on the first semiconductor pillar; and
   an interconnect on the first plug.

2. The device of claim 1, further comprising:
   a second semiconductor pillar above the semiconductor substrate; and
   a third insulating layer covering a side of the second semiconductor pillar, wherein
   the conductive layers and second insulating layers further covering the third insulating layer.

3. The device of claim 2, further comprising:
   a second plug on the second semiconductor pillar; and
   a bit line on the second plug.

4. The device of claim 1, wherein
   the interconnect is electrically coupled to a well of a first conductivity type in the surface of the semiconductor substrate.

5. The device of claim 4, wherein
   the device further comprises a second interconnect adjacent the interconnect, and
   the second interconnect is electrically coupled to an impurity diffusion layer of a second conductivity type in the surface of the semiconductor substrate.

6. The device of claim 2, wherein
   the device comprises pillars including the first and second semiconductor pillars, and
   the pillars are lined up regularly along a surface of the semiconductor substrate.

7. The device of claim 3, wherein
   the device comprises plugs including the first and second plugs, and
   the plugs are lined up regularly along a surface of the semiconductor substrate.

8. The device of claim 2, wherein
   the first insulating layer comprises a block insulating layer, a charge storage layer, and a tunnel insulating layer.

9. The device of claim 8, wherein
   the block insulating layer, the charge storage layer, and the tunnel insulating layer comprise a silicon oxide layer, a silicon nitride layer, and a silicon oxide layer, respectively.

* * * * *